United States Patent

Goujard et al.

[11] Patent Number: 5,738,951
[45] Date of Patent: Apr. 14, 1998

[54] METHOD OF MANUFACTURING A COMPOSITE MATERIAL WITH LAMELLAR INTERPHASE BETWEEN REINFORCING FIBERS AND MATRIX, AND MATERIAL OBTAINED

[75] Inventors: Stéphane Goujard; Pascal Dupel, both of Merignac; René Pailler, Cestas; Fabrice Heurtevent, Bordeaux, all of France

[73] Assignee: Societe Europeene de Propulsion, Suresnes, France

[21] Appl. No.: 619,544
[22] PCT Filed: Sep. 20, 1994
[86] PCT No.: PCT/FR94/01091
 § 371 Date: Mar. 25, 1996
 § 102(e) Date: Mar. 25, 1996
[87] PCT Pub. No.: WO95/09136
 PCT Pub. Date: Apr. 6, 1995

[30] Foreign Application Priority Data

Sep. 27, 1993 [FR] France .................. 93 11438

[51] Int. Cl.[6] ...................................... B32B 9/00
[52] U.S. Cl. .................. 428/698; 428/367; 428/368; 428/688; 428/689; 442/59; 501/95; 427/585; 427/589; 427/590
[58] Field of Search ..................... 428/367, 368, 428/902, 408, 688, 689, 698; 442/59; 501/95; 427/585, 590, 589

[56] References Cited

U.S. PATENT DOCUMENTS 5,354,602 10/1994 Stranford et al. .................. 428/220

FOREIGN PATENT DOCUMENTS

| 0172082 | 2/1986 | European Pat. Off. |
| 0353380 | 2/1990 | European Pat. Off. |
| 0380375 | 8/1990 | European Pat. Off. |
| 0424036 | 4/1991 | European Pat. Off. |
| 0528411 | 2/1993 | European Pat. Off. |
| 0549224 | 6/1993 | European Pat. Off. |
| 0626360 | 11/1994 | European Pat. Off. |
| 2673937 | 9/1992 | France |

*Primary Examiner*—Patrick Ryan
*Assistant Examiner*—J. M. Gray
*Attorney, Agent, or Firm*—Weingarten, Schurgin, Gagnebin & Hayes LLP

[57] ABSTRACT

The interphase is formed by nanometric scale sequencing of a plurality of different constituents including at least a first constituent that intrinsically presents a lamellar microtexture, and at least a second constituent that is suitable for protecting the first against oxidation. A plurality of elementary layers of a first constituent of lamellar microtexture, e.g. selected from pyrolytic carbon, boron nitride, and $BC_3$ are formed in alternation with one or more elementary layers of a second constituent having a function of providing protection against oxidation and selected, for example, from SiC, $Si_3N_4$, $SiB_4$, $SiB_6$, and a codeposit of the elements Si, B, and C. The elementary layers of the interphase are preferably less than 10 nanometers thick and they are formed by chemical vapor infiltration or deposition in pulsed form.

13 Claims, 2 Drawing Sheets

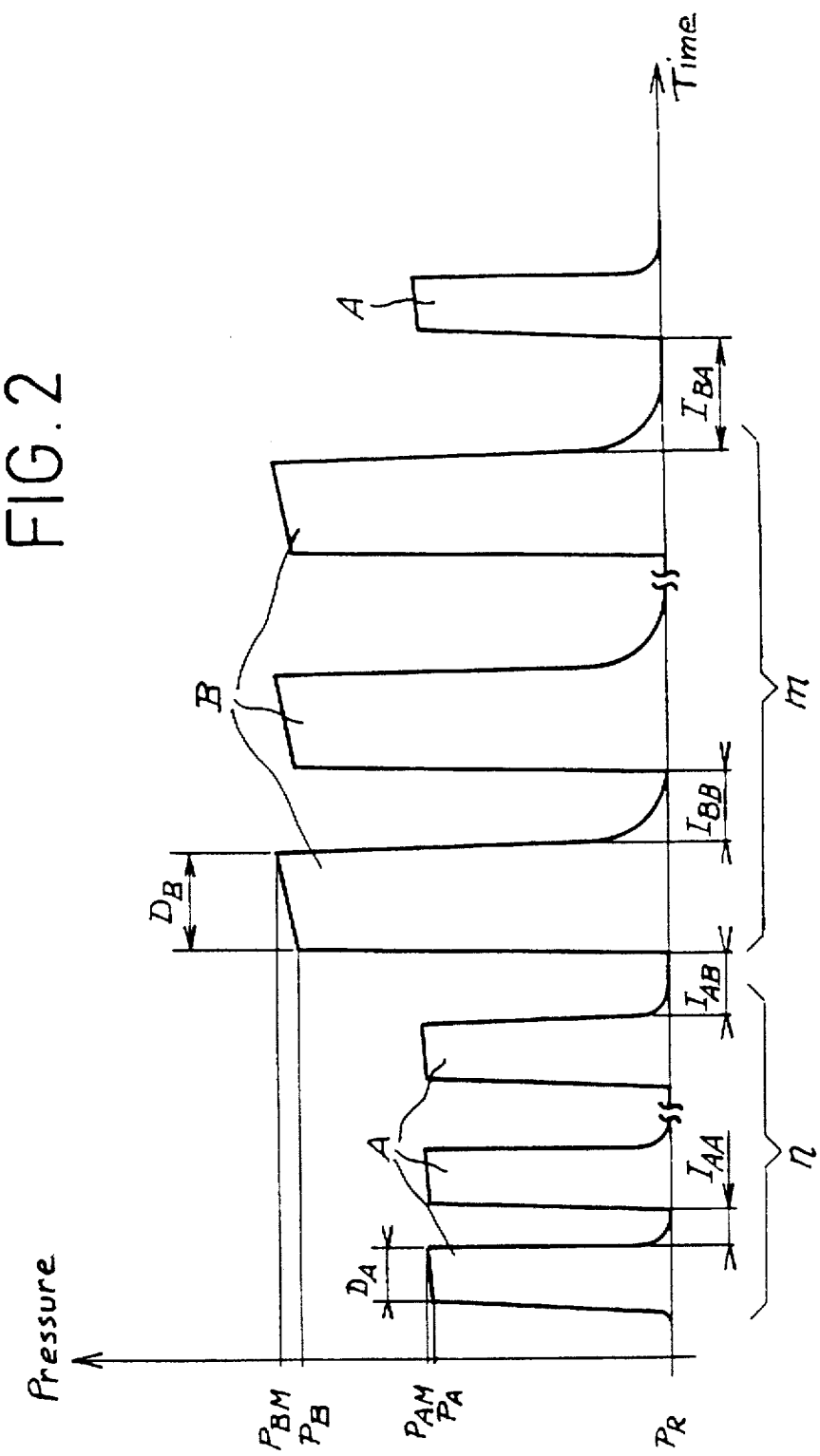

METHOD OF MANUFACTURING A COMPOSITE MATERIAL WITH LAMELLAR INTERPHASE BETWEEN REINFORCING FIBERS AND MATRIX, AND MATERIAL OBTAINED

FIELD OF THE INVENTION

The present invention relates to manufacturing composite materials comprising fiber reinforcement densified by means of a matrix, and having a lamellar interphase between the reinforcing fibers and the matrix.

A particular field of application of the invention is that of thermostructural composite materials. Such materials are characterized by mechanical properties that make them suitable for constituting structural elements, and by the ability to retain their mechanical properties up to high temperatures. Thermostructural composite materials are used, in particular, for making parts of engines or of reactors, or for making structural elements of space vehicles which are exposed to severe heating.

BACKGROUND OF THE INVENTION

Examples of thermostructural composite materials include carbon/carbon (C/C) composites comprising carbon fiber reinforcement and a carbon matrix, and ceramic matrix composites (CMC) comprising refractory (carbon or ceramic) fiber reinforcement and a ceramic matrix. Common CMCs are C/SiC composites (carbon fiber reinforcement and a silicon carbide matrix) and SiC/SiC composites (reinforcing fibers based on silicon carbide, and a silicon carbide matrix).

Composite materials in which the reinforcement is constituted by long fibers are known to possess greater toughness and greater mechanical strength than the corresponding monolithic materials.

In the case of thermostructural composites, it is also known that greater toughness is obtained by interposing an interphase between the fibers and the matrix, the interphase serving to transfer load from the matrix to the fibers while simultaneously deflecting cracks that appear in the matrix when the material is subjected to mechanical stress, thereby ensuring that the cracks do not propagate to the fibers, and simultaneously relieving residual stresses at the bottoms of the cracks.

To achieve these objects, the Applicants' document EP-A-0 172 082 proposes forming an interphase on the reinforcing fibers prior to densification of the matrix, the microtexture of the interphase being lamellar. That is achieved by forming on the fibers a layer of pyrolytic carbon (PyC) of the rough laminar type, or a layer of boron nitride (BN) obtained by chemical vapor infiltration or deposition. The stacks of sheets of atoms of PyC or of BN impart the lamellar microtexture to the interphase. In the resulting final material, when a crack reaches the interphase after propagating through the matrix, its mode of propagation is modified so that the crack is deflected parallel to the sheets of atoms in the interphase, i.e. parallel to the fiber, thereby protecting the fiber. In addition, because of its elastic nature in shear, the PyC or BN lamellar interphase serves to relieve the stresses at the bottom of the crack. By preserving the fibers in the cracked material, the material conserves its integrity and its mechanical properties, and consequently it presents much greater toughness than the same matrix material when it is monolithic.

It is well known that the microtexture of a PyC obtained by chemical vapor infiltration or deposition depends on infiltration or deposition conditions, and in particular on temperature and pressure. Thus, depending on conditions, it is possible to obtain PyCs that are highly anisotropic (lamellar microtexture), such as PyC of the rough laminar type, or PyCs that are not very anisotropic, (non-lamellar microtexture), such as PyC of the smooth laminar type. Unfortunately, during deposition of a PyC interphase whose thickness is typically greater than one hundred nanometers, it has been observed that the microtexture of the PyC can vary within the interphase, going from the rough laminar type to the smooth laminar type, and that this can happen without deposition conditions changing. Such uncontrolled variation means that the interphase no longer has optimum microtexture, with the main consequence of the mechanical properties of the composite material being less good than could have been expected from the reinforcing capacity of the fibers.

The person skilled in the art also knows that PyC interphase composites are poor at withstanding prolonged exposure to an oxidizing atmosphere at high temperature and under mechanical stress. This weakness constitutes a major limitation on the use of SiC matrix composites with a PyC interphase, and it is due to the property of the PyC interphase whereby it oxidizes as soon as the temperature reaches 450° C. to 500° C., forming volatile oxides ($CO_2$ and/or $CO$, depending on temperature), thereby causing an annular pore to be formed around each fiber. Such oxidation is made easier by the cracking of the matrix under mechanical stress and, other things remaining equal, it becomes easier with increasing number of active sites, i.e. with increasing imperfection of the structure of the PyC microtexture.

Oxidation of the interphase can have two types of consequence: it can destroy fiber-matrix coupling (load is no longer transferred between them), or it can "unite" the fibers to the matrix with the composite material then becoming brittle (catastrophic propagation of matrix cracks to the fibers), with this depending on the nature of the matrix, the thickness of the interphase, and conditions of use. In practice, deep oxidation of the PyC interphase frequently leads to total loss of the mechanical properties of the composite material.

The use of a BN interphase improves to some extent the behavior of composite materials in an oxidizing environment compared with the use of a PyC interphase. However, a BN interphase suffers from the same drawback as a PyC interphase, i.e. it is impossible to control accurately the microtexture of the interphase throughout the thickness thereof. As a general rule, BN interphases formed by chemical vapor infiltration or deposition do not have a suitable lamellar texture for enabling them to perform the looked-for functions effectively.

To avoid using materials of lamellar microtexture, such as PyC and BN, with the drawbacks that they entail, in particular insufficient resistance to oxidation at high temperatures, it is proposed in document FR-A-2 673 937 to make an interphase that is not oxidizable, being made up of a plurality of layers that impart a generally laminated structure thereto by mechanical means. The layers making up the interphase are made of oxide type ceramic (e.g. alumina or zirconia) or non-oxide type ceramic (e.g. silicon carbide or silicon nitride). In order to conserve weak bonding between the layers, thereby giving the overall interphase its laminated texture, the layers are made of different ceramics during distinct chemical vapor deposition steps. Proposals have also been made to form ceramic layers that have different morphologies, with chemical vapor deposition conditions being varied from one layer to another. Proposals have also been made to inhibit chemical bonding between layers of the same ceramic by doping the layers with impurities or by modifying their surface states.

The above solutions require a plurality of chemical vapor depositions to be performed, either under different conditions or else with intermediate steps. They are therefore lengthy and expensive to implement. In addition, the number of layers making up the interphase cannot be too great, since that requires a corresponding number of chemical vapor deposition operations. As a result the laminated nature remains limited (five to ten layers) and the thickness of the layer (several tens of nanometers) is much greater than the distance between sheets of atoms (about 0.33 nanometers) in PyC or BN interphases of lamellar microtexture.

SUMMARY OF THE INVENTION

An object of the invention is to provide a method enabling a composite material to be made with a lamellar interphase between reinforcing fibers and a matrix, and having improved thermomechanical properties in an oxidizing medium.

A particular object of the invention is to provide a method enabling interphases to be formed of controlled lamellar microtexture capable of withstanding oxidation without requiring lengthy and expensive deposition operations.

These objects are achieved by a method of the type comprising making fiber reinforcement in which the fibers are provided with a lamellar interphase coating made up of a plurality of layers, and densification by means of a matrix for the reinforcing fibers provided with the lamellar interphase, in which method, according to the invention, the lamellar interphase is formed by a nanometric-scale sequence of a plurality of different constituents of which at least a first constituent intrinsically presents a lamellar microtexture and at least a second constituent is suitable for protecting the first against oxidation.

Herein, "nanometric scale sequence of a plurality of constituents" means successively forming elementary layers each of nanometer order thickness, i.e. layers that are each preferably less than 10 nanometers thick.

One or more nanometric layers of a first constituent having lamellar microtexture, e.g. PyC, BN, or $BC_3$, can be formed in alternation with one or more nanometric layers of a second constituent having a function of providing protection against oxidation. The second constituent is preferably a refractory material having healing properties, either intrinsically or via an oxidation product. At the temperatures at which the composite material is used, this healing function is provided by taking up a semi-liquid state enabling any pores that may appear in the interphase to be plugged and "coating" the constituent having lamellar microtexture. Materials suitable for this purpose are those capable of giving rise to glasses, in particular materials based on silica and/or on boron. Mention may be made in particular of silicon carbide (SIC) or silicon nitride ($Si_3N_4$) which give silica on being oxidized, and of silicon borides ($SiB_4$, $SiB_6$) or compounds taken from the triplet SiBC (co-deposition of the elements Si, B, and C) that give borosilicate glass on oxidation. The choice of material depends in particular on the conditions in which the composite material is to be used, so as to ensure that the glass takes up a semi-liquid state at the temperature of use.

A feature of the invention thus consists in associating, within the interphase, at least a first constituent of lamellar microtexture, and at least a second constituent having a function of providing protection against oxidation. An interphase is thus obtained having a lamellar microtexture with integrated protection against oxidation.

Another feature of the invention consists in implementing the interphase by nanometric sequencing. This is preferably performed by chemical vapor infiltration or deposition in a chamber within which a plurality of successive cycles are performed each comprising injecting a reaction gas and maintaining it within the chamber for a first time interval of predetermined duration so as to form an elementary interphase layer of controlled nanometer-order thickness, followed by evacuating the gaseous reaction products during a second time interval, with the cycles being performed consecutively in the chamber until the interphase has reached the desired thickness.

The microtexture and the thickness of each layer can then be controlled accurately by precise conditions determined by the chemical vapor infiltration or deposition and by its duration, during each cycle. This avoids any undesirable change of the microstructure, as has been observed in the prior art when the interphase is formed in a single chemical vapor infiltration or deposition operation.

Advantageously, the elementary layers of the interphase are formed during consecutive cycles, while the reinforcing fibers remain in the enclosure within which the chemical vapor infiltration or deposition operations are performed. Each first portion of a cycle, during which a reaction gas is admitted into and maintained within the chamber until a nanometric elementary layer has been obtained, lasts for a duration that may be limited to a few seconds or a few tens of seconds. Each second portion of a cycle, during which the gaseous reaction products are evacuated from the chamber, e.g. by pumping and by sweeping with an inert gas, has a duration that normally does not exceed one or a few seconds. Because the cycles follow one another consecutively, and advantageously without interruption, and because the duration of each cycle is short, the total time required for forming the interphase is relatively short, even when several tens of cycles are necessary.

Contrary to the teaching of document FR-A-2 673 937, no special precautions need to be taken to avoid bonding between the elementary layers that are formed in succession. The lamellar nature of the interphase is provided by the first constituent thereof, and not by the lamination due to the formation of mutually non-bonded layers.

As already mentioned, one or more consecutive layers of the first constituent having lamellar microtexture may alternate with one or more consecutive layers of the second constituent. The layers of the first constituent and the layers of the second constituent may be of thicknesses that are equal or unequal. The thicknesses may be constant throughout the interphase or they may vary, with thickness variation being controlled by varying parameters of the chemical vapor infiltration or deposition (partial pressures of the components of the reaction gas in the reaction chamber, durations of the first portions of the cycles, . . . ).

By varying the thicknesses of the layers of the first and/or of the second constituent and/or by varying the ratio between the number of layers of the first constituent and the number of layers of the second constituent, it is possible to vary the proportion of at least one of the constituents across the thickness of the interphase so as to obtain a desired composition gradient.

In a particular implementation of the invention, one of the two constituents can be obtained by modifying the reaction gas that provides the other constituent, e.g. by adding a component to said gas which disturbs deposition and which imparts different characteristics thereto.

Another possibility consists in performing cycles in which the duration of the first portion (admitting and maintaining the reaction gas) takes different values. Lengthening the duration during which the gas admitted into the enclosure is maintained therein without external communication has the effect of depleting the gas which, beyond some limit, can cause the nature of the deposition to be modified. For example, a reaction gas that causes silicon carbide to be deposited may, after some length of time, give rise to said gas being depleted, whereupon both silicon carbide and carbon will be codeposited. The passage from one interphase constituent to the other thus takes place merely by varying the duration of deposition within a cycle.

The lamellar interphase may be formed on the fibers of the fiber reinforcement at any stage in the manufacture of the reinforcement from fiber roving to a made-up multidirectional fiber preform having the shape of a part of composite material that is to be made, and including various intermediate stages, e.g. a fabric obtained by weaving fiber roving. Nevertheless, it is preferable for the interphase to be made directly on the preform, i.e. the last stage in preparation of the fiber reinforcement.

DESCRIPTION OF THE DRAWINGS

The invention will be better understood on reading the following description of examples given by way of non-limiting indication.

Reference is made to the accompanying drawings, in which:

FIG. 2 shows how pressure varies as a function of time within the chemical vapor infiltration chamber of the FIG. 1 installation while implementing the method of the invention.

Figure 1:
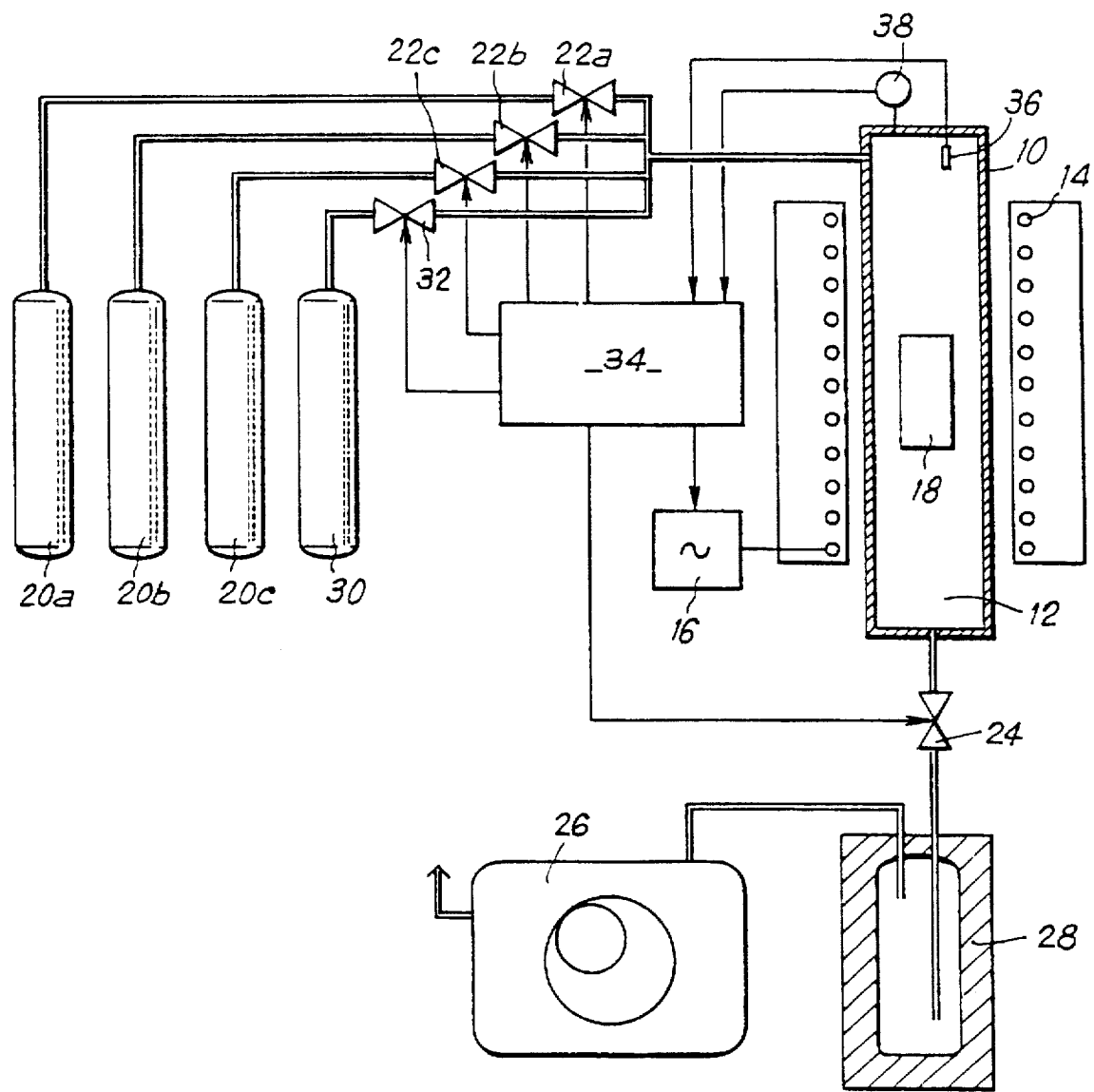
FIG. 1 is a highly diagrammatic overall view of an installation suitable for implementing the method of the invention.

DESCRIPTION OF THE PREFERRED
EMBODIMENT(S)

An installation for implementing the method of the invention is shown in FIG. 1. The installation is of the type commonly used for performing chemical vapor infiltration operations. In conventional manner it comprises a graphite core 10 defining a reaction chamber 12. The core 10 is surrounded by a metal inductor 14 with thermal insulation being interposed therebetween. The assembly comprising the core 10 and the inductor 14 may be housed within a sealed enclosure, e.g. as described in document WO-A-87/04733.

A fiber substrate 18 whose fibers are to be coated in an interphase of lamellar microtexture is placed within the chamber 12. The state of the substrate 18 may be that of fiber roving, threads, cloth, or some other two-dimensional structure (sheets of unidirectional threads or cables, layers of felt, ...), or it may be a three-dimensional structure constituting a preform for a part of composite material that is to be made in accordance with the invention. The interphase is formed on the fibers of the substrate 18 by sequentially depositing nanometric elementary layers of various different constituents. Each elementary layer is formed by admitting a reaction gas into the chamber 12, thereby giving rise to the looked-for deposit under predetermined conditions of partial pressure for the, or each, constituent of the gas in the chamber, and of temperature within the chamber, by decomposition of the gas or by reaction of its constituents on coming into contact with the fibers of the substrate 18.

Gases suitable for forming deposits of the desired kind are admitted to the top of the chamber 12 from gas sources 20a, 20b, 20c, ... via respective injection valves 22a, 22b, 22c, .... In some cases, the constituents of the gas come from different sources and are mixed together on being admitted into the chamber 12.

The number and the kinds of gas sources depend on the constituents selected for the elementary layers making up the interphase. By way of non-limiting example, the following sources may be provided:

a source of an alkane, in particular propane, or a mixture of alkanes, which, on decomposing, can give rise to a deposit of PyC;

a source of methyltricholorosilane (MTS) $CH_3SiCl_3$ and a source of hydrogen ($H_2$), MTS giving rise to a deposit of SiC in the presence of $H_2$ acting as a catalyst;

a source of ammonia ($NH_3$) and a source of boron trifluoride ($BF_3$) which, when admitted separately into the chamber, react therein to give rise to a deposit of BN.

After each elementary interphase layer has been formed, the gaseous reaction products, including the remainder of the reaction gas, are extracted from the bottom portion of the chamber 12. Extraction is performed by opening a stop valve 24, thereby putting the chamber 12 into communication with a vacuum pump 26 via a liquid nitrogen trap 28 that serves to retain undesirable gaseous species and to prevent them being exhausted into the environment. Reaction gas extraction by evacuation may be replaced or supplemented by sweeping the chamber 12 with an inert gas, such as nitrogen or argon, which gas is injected into the enclosure from a source 30 via an injection valve 32.

The valves 22a, 22b, 22c, ..., 24, and 32 are controlled by an automatic controller 34. The controller also receives signals from sensors 36 and 38 representing the temperature and the pressure inside the enclosure. On the basis of these signals, the controller controls an electrical power supply 16 for the inductor 14 to cause a predetermined temperature to exist within the chamber 12, and it controls the stop valve 24 so that a determined pressure exists within the enclosure prior to each admission of reaction gas.

The lamellar interphase is advantageously made by chemical vapor infiltration that is implemented in pulsed manner. Each elementary layer constituting the interphase is formed during a cycle that comprises injecting reaction gas corresponding to the nature of the elementary layer to be formed and maintaining said gas for a predetermined duration (first portion of a cycle), and then extracting the reaction products (second portion of a cycle). Advantageously, cycles follow one another without interruption.

This succession of cycles is illustrated in FIG. 2. The interphase is formed by an alternation of n elementary layers of the first constituent and of m elementary layers of the second constituent. Each elementary layer of the first constituent is formed during an A cycle that comprises raising the pressure from the value $P_R$ of the residual pressure in the chamber to a value $P_A$ by admitting a first gas that gives rise to the first constituent, maintaining pressure for a duration $D_A$ for depositing the elementary layer, and then extracting the reaction products until the pressure returns to $P_R$. In similar manner, each elementary layer of the second constituent is formed during a B cycle comprising raising the pressure from the value $P_R$ to a value $P_B$ by admitting a second gas that gives rise to the second constituent, maintaining said pressure during a duration $D_B$ for deposition of the elementary layer, and extracting the reaction products to return to the pressure $P_R$.

At the beginning of a cycle, the admission of the reaction gas causes the pressure in the chamber to rise suddenly. This admission is performed by the controller 34 causing the corresponding injection valve(s) to open for the duration required, given the gas flow rate, to achieve the desired pressure $P_A$ (or $P_B$) in the chamber 12. This represents the partial pressure of the gas constituting the reaction gas when it is a single constituent gas, or the sum of the partial pressures constituting the reaction gases when a plurality of constituents are involved. The pressure $P_A$ or $P_B$ is selected, as is the temperature inside the chamber, so as to obtain a deposit of the desired texture and kind. The elementary layer is deposited until the end of the duration $D_A$ or $D_B$. The stop valve 24 is then opened by the controller 34 causing the reaction products to be extracted and causing the pressure in the chamber 12 to drop from the residual value $P_{AM}$ or $P_{BM}$ as achieved at the end of the deposition period down to the value $P_R$, at which value the pressure is maintained until the beginning of the following cycle.

The duration $D_A$ or $D_B$ of deposition is selected as a function of the thickness desired for the elementary layer. As an indication, for forming a nanometric layer as is required in this case (i.e. a thickness of less than 10 nanometers) this duration may lie within the range a few seconds to one minute, it being observed that the deposition rate depends also on the constituent material of the elementary layer, on temperature, on pressure, on the shape of the chamber, and on the way in which the chamber is filled.

The duration necessary for passing from residual pressure $P_R$ to pressure $P_A$ or $P_B$ is generally about one second, and at most a few seconds, while the duration required for extracting the reaction products and for returning to the pressure $P_R$ is generally several seconds, and at most about ten seconds.

As a result, the total duration of a cycle can be limited to a few tens of seconds. Thus, even when several tens of cycles are necessary to achieve the total thickness desired for the interphase (at least 100 nanometers and generally several hundreds of nanometers), the total time required to form the interphase is relatively short.

The numbers n and m are integers, they may be equal to 1, and they are selected as a function of the desired distribution between the first and second constituents in the interphase. These values may be constant or variable across the thickness of the interphase. It is thus possible to vary the concentration of one of the constituents of the interphase across the thickness thereof. In addition, controlled variation in the thickness and/or in the microtexture of the elementary layers of the first constituent and/or of the second constituent can be achieved by varying the parameters $D_A$ and/or $P_A$ and/or the parameters $D_B$ and/or $P_B$.

As already mentioned, it is possible to make an interphase having two different constituents while using the same reaction gas. To this end, for one of the cycles, e.g. the B cycle, the deposition duration $D_B$ is longer than the deposition duration $D_A$ of the A cycle so that reaction gas depletion gives rise to a change in the nature of the deposit. The reaction that gives rise to the deposit takes place in a closed environment, i.e. the reaction gas is not renewed. As a result, the composition and/or the partial pressure thereof can change sufficiently to alter the deposit. This applies when using a gas comprising MTS+$H_2$ which normally gives rise to a deposit of SiC. It has been observed that when this gas is depleted, and after a certain length of time, there arises co-deposition of SiC and of carbon.

In the example shown in FIG. 2, the time interval $I_{AA}$, $I_{AB}$, $I_{BB}$, or $I_{BA}$ between successive different cycles is chosen merely to ensure that the reaction products are extracted and that the pressure within the chamber returns to the residual pressure $P_R$. Naturally, that is appropriate when the deposition temperatures are the same for A cycles and for B cycles. Otherwise, each transition $I_{AB}$ or $I_{BA}$ between an A cycle and a B cycle or vice versa would need to be of sufficient duration for the temperature within the chamber to stabilize on a value that is suitable for the forthcoming cycle.

Examples of implementations of the invention are described below.

EXAMPLE 1

Monofilaments taken from silicon carbide fiber roving (in fact roving made of an Si—C—O composition) sold under the name NICALON NL202 by the Japanese Nippon Carbon Company were stuck together at their ends on graphite support frames in order to keep them rectilinear. Each support frame together with its monofilaments was inserted into an infiltration chamber. The chamber was filled alternately with propane, and with a mixture of MTS/$H_2$ at a volume ratio of $|H_2|/|MTS|=6$, under the conditions specified in Table I, so as to coat each of the filaments in a two-constituent interphase comprising PyC and SiC. Infiltration was performed using sequences as shown in FIG. 2 by alternating four A cycles having propane admission to form elementary layers of rough laminar PyC having a thickness of 2.5 nm with six B cycles having admission of the MTS/$H_2$ mixture to form elementary layers of SiC having a thickness of 1.5 nm. The above was repeated five times to give rise to an overall interphase thickness equal to [2.5×4+1.5×6]×5=95 nm. Thereafter, the monofilaments covered in this way in PyC/SiC interphase were individually coated in a pure SiC matrix formed by conventional chemical vapor deposition using an MTS/$H_2$ mixture so that the volume fraction of fibers in the microcomposites did not exceed about 30% (samples I).

Another series of microcomposites was made by depositing on each Si—C—O monofilament an interphase having the same overall thickness (100 nm) but constituted solely of PyC, and then coating each covered monofilament in an SiC matrix in similar manner (samples II). The PyC interphase was obtained by chemical vapor infiltration implemented in pulsed manner by performing successive cycles of propane admission such as the above-described A cycles.

TABLE I

| Deposit | Nature of the gas | Deposition temperture (K.) | Deposition pressure (kPa) | Deposition duration per cycle (s) | Thickness deposited per cycle (nm) | No. of successive cycles per sequence |
|---|---|---|---|---|---|---|
| PyC | $C_3H_8$ | 1273 | 3 | 2 | ≈2.5 | 4 |
| SiC | MTS + $H_2$ $\frac{[H_2]}{[MTS]}=6$ | 1273 | 3 | 2 | ≈1.5 | 6 |

A fraction of the microcomposites was tested straight from manufacture and at ambient temperature using a microtraction machine. The results are given in Table II and they show that the breaking characteristics of the two families of material are similar, with microcomposites having a two-constituent interphase $(PyC/SiC)_5$ (samples I) having no significant advantage over micro-composites having a PyC interphase (samples II) when tested under such conditions.

EXAMPLE 2

Example 1 was reproduced using identical Si—C—O monofilaments and building up a nanometrically-sequenced interphase thereon, while modifying deposition conditions as shown in Table III.

TABLE III

| Deposit | Nature of the gas | Deposition temperture (K.) | Deposition pressure (kPa) | Deposition duration per cycle (s) | Thickness deposited per cycle (nm) | No. of successive cycles per sequence |
|---|---|---|---|---|---|---|
| PyC | $C_3H_8$ | 1173 | 3 | 15 | ≈1 | 5 |
| SiC | MTS + $H_2$ $\frac{[H_2]}{[MTS]} = 3$ | 1173 | 1 | 2 | ≈2 | 5 |

In Table II:

$V_f$ designates the volume fraction occupied by the fibers (percentage of the volume of the composite occupied by fibers)

$F_E$ designates load at the elastic limit $F_R$ designates breaking (rupture) load.

TABLE II

| Samples | $V_f$ (%) | $\epsilon^E$ (%) | $F_E$ (N) | $\sigma^E$ (MPa) | E (GPa) | $\epsilon^R$ (%) | $F_R$ (N) | $\sigma^R$ (MPa) |
|---|---|---|---|---|---|---|---|---|
| Interphase I $(PyC/SiC)_5$ | 23 | 0.084 | 0.161 | 249 | 335 | 0.186 | 0.272 | 500 |
| Interphase II PyC (100 nm) | 31 | 0.08 | 0.127 | 283 | 346 | 0.236 | 0.260 | 550 |

The remainder of the microcomposites were aged under an oxidizing atmosphere (air) while loaded at 75% of their breaking stress (so as to give rise to multiple cracking of the SiC matrix) at temperatures lying in the range ambient to 1200° C. After cooling, the microcomposites were tested in traction at ambient temperature as described above. It was observed that the residual mechanical characteristics on breaking were degraded as from aging at 600° C. for microcomposites having a PyC-only interphase, whereas the characteristics were maintained substantially even after aging at 1200° C. for microcomposites having the (PyC/SiC)$_5$ interphase. This example shows the advantage that results from using PyC in the interphase as is made possible by the invention in which the interphase is built up nanometric layer by nanometric layer with PyC (sensitive to oxidation) alternating in controlled manner with SiC (which protects the carbon with silica which it forms when hot in an oxidizing atmosphere). Even if the nanometric sequencing of the PyC/SiC does not of itself give rise to a spectacular improvement in this type of material as compared with a PyC interphase in terms solely of transferring load, of suitability for deflecting cracks in the matrix, and/or of relieving residual stresses, it nevertheless gives rise to a spectacular improvement in resistance to oxidation under load.

The forces that must be exerted to cause them to break are close to those obtained in the preceding example (Table II).

These microcomposites and microcomposites having a conventional pyrocarbon interphase were maintained under traction at 600° C. in air loaded at 70% of their breaking strength.

The microcomposites having a nanometrically-sequenced interphase broke after a mean duration of 40 hours whereas those having a pyrocarbon interphase broke after a duration of 20 hours, thereby confirming the advantage of such lamellar interphases in an oxidizing environment.

EXAMPLE 3

Example 1 was repeated, replacing the Si—C—O— fiber monofilaments from the Nippon Carbon Company with monofilaments taken from Si—C—Ti—O fiber roving sold under the name "Tyrano" by the Japanese UBE Company. The results of traction tests, given in Table IV, show that the interphase with nanometric sequencing (PyC/SiC)$_5$ (samples III) did not significantly improve the breaking characteristics of the microcomposites (Young's modulus was greater but stress and deformation at breakage were smaller) as compared with the PyC interphase (samples IV) when the materials were tested immediately after being made. In contrast, after aging in air at 800° C. for 24 hours, the residual breaking characteristics of microcomposites having the (PyC/SiC)$_5$ interphase were conserved whereas those of the PyC interphase became much smaller ($\sigma^R$<120 MPa).

TABLE IV

| Samples | $V_f$ (%) | $\epsilon^E$ (%) | $F_E$ (N) | $\sigma^E$ (MPa) | E (GPa) | $\epsilon^R$ (%) | $F_R$ (N) | $\sigma^R$ (MPa) |
|---|---|---|---|---|---|---|---|---|
| Interphase III $(PyC/SiC)_5$ | 63 | 0.12 | 0.032 | 266 | 241 | 0.302 | 0.065 | 600 |
| Interphase IV PyC (100 nm) | 76 | 0.12 | 0.026 | 257 | 213 | 0.475 | 0.094 | 900 |

EXAMPLE 4

Example 1 was reproduced by creating on Si—C—O monofilaments a nanometrically-sequenced interphase, not by modifying the nature of the reaction gases injected into the infiltration chamber, but by using the same reaction gas while sequentially increasing the duration of one (or more) deposition periods. As when depositing SiC from the $CH_3SiCl_3/H_2$ mixture, this procedure gave rise to in situ depletion of $CH_3SiCl_3$ in the gas and to codeposition of SiC+C. Under such circumstances, the interphase was no longer constituted by a $(PyC/SiC)_n$ sequence, but by a $[(SIC+PyC)/SiC]_n$ sequence in which the PyC lamellae were replaced by lamellae of codeposited PyC+SiC, the lamellae of pure SiC remaining unchanged. After deposition of the interphase, the SiC matrix was deposited as described in Example 1. The deposition conditions for the elementary layers of SiC+C and of SiC are given in Table V.

TABLE V

| Deposit composition | Deposition temperature (K) | Deposition pressure (kPa) | Deposition duration per cycle (s) | Thickness deposited per cycle (nm) | No. of successive cycles per sequence |
|---|---|---|---|---|---|
| Atomic 50/50 SiC + C | 1273 | 3 | 20 | ≈3.5 | 2 |
| SiC | 1273 | 3 | 2 | ≈1.5 | 6 |

The microcomposites of the $[(SIC+PyC)/SiC]_n$ interphase were tested in traction at ambient temperature. Their mechanical characteristics at breakage were close to (although slightly poorer than) those given in Table II for corresponding $(PyC/SiC)_n$ microcomposites. In contrast, the fact of reducing the overall free carbon content in the interphase and above all of dispersing the free carbon on a nanometric scale within the unoxidizable SiC material had the effect of giving microcomposites with the $[(SIC+PyC)/SiC]_n$ interphase better strength under load in a oxidizing medium. This example shows the possibilities provided by the invention for controlled construction of the interphase in ceramic matrix composites.

EXAMPLE 5

Fabrics made up of Si—C—O fibers (NICALON fibers from the Nippon Carbon Company) were stacked in tooling and then a first batch was covered (samples V) in a nanometrically-sequenced PyC/SiC interphase having an overall thickness of 300 nm with a gradient of SiC composition relative to thickness (SiC concentrating going from 10% by volume at the fiber/interphase interface to about 90% by volume in the vicinity of the interphase/matrix interface), and a second batch (samples VI) were covered in a 100 nm thick PyC interphase by conventional chemical vapor infiltration. The two preforms treated in this way were densified by an SiC matrix by conventional chemical vapor infiltration. The SiC composition gradient in the interphase was obtained by progressively increasing the ratio m/n across the series of SiC layers alternating with series of PyC layers.

Two types of mechanical tests were performed on parallelepipedal test pieces having dimensions of 60 mm×10 mm×3 mm cut out from the resulting materials: (i) traction tests were performed at ambient temperature both before and after aging under load in air; and (ii) 4-point bending tests were performed both before and after aging in air (top points 25.4 mm apart, bottom points 50.8 mm apart). Table VI gives the results of the tests.

TABLE IV

| Samples | Traction at ambient temperature | | Bending at ambient temperature | |
|---|---|---|---|---|
| | $\sigma^R$ (MPa) | $\sigma^{R*}$ (MPa) | $\sigma^R$ (MPa) | $\sigma^{R**}$ (MPa) |
| V (300 nm) | 200 | 180 | 440 | 420 |
| VI (100 nm) | 180 | <10 | 420 | ≈0 |

*After 40 hours in air at 1000° C.
**After 20 hours in air at 1200° C. under bending.

Table VI shows that composites V and VI immediately after being made have similar breaking strengths. In contrast, after being aged in air, the composite having a conventional PyC interphase (samples VI) had lost nearly all of its strength whereas the composite having an interphase that was sequenced and that had a composition gradient (samples V) in which carbon was dispersed in SiC, retained practically all of its initial breaking strength.

In addition, the same materials, when subjected to a traction stress of 150 MPa (giving rise to multiple cracking in the SiC matrix) at 600° C. in an oxidizing atmosphere (air) had very different lifetimes: material V did not break after 100 hours whereas material VI broke after 25 hours.

Although the above description relates to making interphases having two constituents, it is possible to envisage making interphases out of more than two constituents, e.g. by using a plurality of constituents having lamellar microtexture and/or a plurality of refractory constituents having the function of providing protection against oxidation.

In addition, although the constituent having lamellar microtexture in the above examples is PyC of the rough laminar type, it is naturally possible to use some other constituent having a similar microtexture, such as BN or $BC_3$. BN can be deposited from a precursor comprising a mixture of $BF_3+NH_3$ (at a volume ratio of 1/2). Both gases are sucked in independently from cylinders of $BF_3$ and $NH_3$ and they are mixed together only after penetrating into the infiltration chamber so as to avoid reaction products forming in the pipework. The infiltration temperature is about 1050° C. and the maximum pressure reached during a deposition cycle is about 3 kPa.

We claim:

1. A method of manufacturing a composite material comprising the steps of:
   providing a fiber reinforcement;
   coating the fibers in said fiber reinforcement with an interphase layer by carrying out a plurality of deposition sequences, each sequence including a plurality of deposition cycles, each cycle comprising depositing an elementary layer having a thickness of less than 10 nanometers, and each sequence comprising the forming of at least one elementary layer in a first constituent which intrinsically presents a lamellar microtexture and at least another one elementary layer in a second constituent which is capable of protecting the first constituent against oxidation, whereby the interphase layer is formed by superposed elementary layers; and
   densifying said fiber reinforcement having said interphase coating with a matrix.

2. A method according to claim 1, characterized in that one or more elementary layers of a first lamellar microtexture constituent are formed in alternation with one or more elementary layers of a second constituent which is capable of providing protection against oxidation.

3. A method according to claim 1, characterized in that the first constituent comprises pyrolytic carbon, boron nitride, or $BC_3$.

4. A method according to claim 1, characterized in that the second constituent is a refractory material, which has healing properties, either intrinsically or as a result of oxidation, whereby the material is capable of taking up a semi-liquid state.

5. A method according to claim 1, characterized in that the second constituent comprises SiC, $Si_3N_4$, $SiB_4$, $SiB_6$, or a codeposit of the elements Si, B, and C.

6. A method according to claim 1, characterized in that the interphase is formed by chemical vapor infiltration or deposition within a chamber in which a plurality of successive cycles are performed, each comprising injecting a reaction gas and maintaining it within the chamber for a first time interval having a predetermined duration to form an elementary interphase layer of controlled thickness of nanometer order, followed by evacuating gaseous reaction products during a second time interval, cycles being performed consecutively in the chamber until the interphase reaches the desired thickness.

7. A method according to claim 1, characterized in that the interphase is formed by chemical vapor infiltration or deposition from a single reaction gas resulting in two elementary layers having a difference, the difference obtained by changing the duration of the cycle of formation during which the elementary layers are formed.

8. A method according to claim 1, characterized in that the concentration of one of the constituents of the interphase is caused to vary throughout the thickness thereof.

9. A composite material comprising a fiber reinforcement, a matrix densifying the fiber reinforcement and an interphase coating layer interposed between the fibers of the fiber reinforcement and the matrix, wherein said interphase layer includes a plurality of coating sequences, each sequence including a plurality of elementary layers having a thickness of less than 10 nanometers and comprising at least one elementary layer in a first constituent which intrinsically presents a lamellar microtexture and at least another one elementary layer in a second constituent which is capable of protecting the first constituent against oxidation, whereby the interphase layer is formed by superposed elementary layers.

10. A material according to claim 9, characterized in that the interphase is constituted by an alternation of one or more elementary layers of the first constituent having lamellar microtexture and one or more elementary layers of the second constituent which is capable of providing protection against oxidation.

11. A material according to claim 9, characterized in that the first constituent comprises pyrolytic carbon, boron nitride, or $BC_3$.

12. A material according to claim 9, characterized in that the second constituent is a refractory material, presenting healing properties intrinsically or as a product of oxidation, whereby the material is capable of taking up a semi-liquid state.

13. A material according to claim 9, characterized in that the second constituent comprises SiC, $Si_3N_4$, $SiB_4$, $SiB_6$, or co-deposition of the elements Si, B, and C.

* * * * *